United States Patent
Zhu

(10) Patent No.: US 12,120,869 B2
(45) Date of Patent: Oct. 15, 2024

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei (CN)

(72) Inventor: Mengna Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 402 days.

(21) Appl. No.: 17/647,893

(22) Filed: Jan. 13, 2022

(65) Prior Publication Data

US 2022/0310627 A1  Sep. 29, 2022

Related U.S. Application Data

(63) Continuation of application No. PCT/CN2021/112274, filed on Aug. 12, 2021.

(30) Foreign Application Priority Data

Mar. 24, 2021 (CN) .......................... 202110313866.8

(51) Int. Cl.
    *H01L 21/033* (2006.01)
    *H01L 21/308* (2006.01)
    *H10B 12/00* (2023.01)

(52) U.S. Cl.
    CPC ....... *H10B 12/488* (2023.02); *H01L 21/0332* (2013.01); *H01L 21/0334* (2013.01);
    (Continued)

(58) Field of Classification Search
    CPC ............. H01L 21/0332; H01L 21/0334; H01L 21/0337; H01L 21/3081; H01L 21/3083;
    (Continued)

(56) References Cited

U.S. PATENT DOCUMENTS

| 6,376,391 B1 * | 4/2002 | Olson ................... C23C 16/045 |
| | | 257/E21.546 |
| 2013/0029436 A1 * | 1/2013 | Fujita ................ H01L 21/76224 |
| | | 257/E21.528 |

(Continued)

FOREIGN PATENT DOCUMENTS

| CN | 106653754 A | 5/2017 |
| CN | 108933136 A | 12/2018 |

(Continued)

OTHER PUBLICATIONS

International Search Report cited in PCT/CN2021/112274, mailed Dec. 10, 2021, 8 pages.

*Primary Examiner* — Nicholas J Tobergte
*Assistant Examiner* — William Henry Anderson
(74) *Attorney, Agent, or Firm* — Kilpatrick Townsend & Stockton LLP

(57) ABSTRACT

The present disclosure provides a method for forming a semiconductor structure, which includes: forming first trench structures and second trench structures in a substrate, wherein each of the first trench structures is located between two active regions arranged along a first direction, each of the second trench structures is located between two adjacent active regions arranged along a second direction, and the first trench structures are in communication with the second trench structures; forming first isolation structures and second isolation structures; and forming word lines.

17 Claims, 12 Drawing Sheets

(52) U.S. Cl.
CPC ...... *H01L 21/0337* (2013.01); *H01L 21/3081* (2013.01); *H01L 21/3083* (2013.01); *H01L 21/3086* (2013.01); *H10B 12/053* (2023.02); *H10B 12/34* (2023.02); *H10B 12/315* (2023.02)

(58) Field of Classification Search
CPC ..... H01L 21/3086; H01L 21/762–7621; H01L 21/76224; H01L 21/76229; H01L 21/76232; H01L 29/0603; H01L 29/0607; H01L 29/0642; H01L 29/0649; H01L 29/0653; H10B 12/01; H10B 12/02; H10B 12/05; H10B 12/053; H10B 12/30; H10B 12/31; H10B 12/312; H10B 12/315; H10B 12/34; H10B 12/488

See application file for complete search history.

(56) References Cited

U.S. PATENT DOCUMENTS

| | | | |
|---|---|---|---|
| 2015/0069482 A1 | 3/2015 | Mueller et al. | |
| 2017/0012098 A1* | 1/2017 | Park | H10B 12/30 |
| 2018/0342613 A1* | 11/2018 | Chang | H01L 21/47573 |
| 2020/0373309 A1* | 11/2020 | Teo | H01L 21/3083 |
| 2021/0005614 A1 | 1/2021 | Lin et al. | |
| 2022/0246727 A1* | 8/2022 | Neelapala | H10B 12/053 |

FOREIGN PATENT DOCUMENTS

| | | |
|---|---|---|
| CN | 110021549 A | 7/2019 |
| CN | 110896075 A | 3/2020 |
| CN | 210668358 U | 6/2020 |
| CN | 112002693 A | 11/2020 |

\* cited by examiner

SEMICONDUCTOR STRUCTURE AND METHOD FOR FORMING SEMICONDUCTOR STRUCTURE

CROSS-REFERENCE TO RELATED APPLICATION

This is a continuation of International Application No. PCT/CN2021/112274, filed on Aug. 12, 2021, which claims the priority to Chinese Patent Application No. 202110313866.8, filed on Mar. 24, 2021, and entitled "Semiconductor Structure and Method for Forming Semiconductor Structure". The disclosures of International Application No. PCT/CN2021/112274 and Chinese Patent Application No. 202110313866.8 are hereby incorporated by reference in their entireties.

TECHNICAL FIELD

The present disclosure relates to the technical field of semiconductor manufacturing, and in particular, to a semiconductor structure and a method for forming the semiconductor structure.

BACKGROUND

A dynamic random access memory (DRAM) is a common semiconductor memory device in a computer, and is composed of a plurality of memory cells, and each memory cell generally includes a transistor and a capacitor. The transistor has a gate electrode electrically connected to a word line, a source electrode electrically connected to a bit line, and a drain electrode electrically connected to the capacitor. A word line voltage on the word line can control the turn on and off of the transistor, and thus by means of the bit line, data information stored in the capacitor can be read, or data information can be written into the capacitor.

In the current DRAM structure, a plurality of active regions arranged in an array are provided inside a substrate, and adjacent active regions are isolated from one another through a shallow trench isolation structure. Along extension directions of the word lines, the shallow trench isolation structures and the active regions are arranged alternately. The sizes of the shallow trench isolation structures inside the substrate are all the same, and a depth of the same word line in the shallow trench isolation structures is greater than a depth thereof in the active regions, which causes an obvious coupling effect between parts of the word lines located in the shallow trench isolation structures and the active regions adjacent thereto, thereby affecting the electrical performance of the DRAM.

Therefore, how to reduce the coupling effect between word lines and active regions and improve the electrical performance of a semiconductor structure are technical problems to be solved urgently at present.

SUMMARY

According to some embodiments, the present disclosure provide a method for forming a semiconductor structure, the method for forming the semiconductor structure includes:
a substrate is provided;
a plurality of first trench structures and a plurality of second trench structures are formed in the substrate, so as to divide the substrate into a plurality of active regions arranged in an array along a first direction and a second direction, each of the plurality of first trench structures is located between two of the plurality of active regions arranged in parallel along the first direction, each of the plurality of first trench structures is annular, the plurality of second trench structures are arranged in parallel along the second direction, each of the plurality of second trench structures is located between two adjacent rows of active regions arranged in parallel along the second direction, the plurality of first trench structures are in communication with the plurality of second trench structures, both the first direction and the second direction are parallel to a surface of the substrate, and the first direction intersects with the second direction;
a first isolation structure is formed in each of the plurality of first trench structures, and a second isolation structure is formed in each of the plurality of second trench structures; and
word lines extending along a third direction are formed in the substrate, and the word lines at least penetrate through the first isolation structures and the second isolation structures, and the third direction is parallel to the surface of the substrate and intersects with both the first direction and the second direction.

According to some other embodiments, the present disclosure further provide a semiconductor structure, the semiconductor includes:
a substrate;
a plurality of active regions, and the plurality of active regions are arranged in an array along a first direction and a second direction inside the substrate, both the first direction and the second direction are parallel to a surface of the substrate, and the first direction intersects with the second direction;
first isolation structures and second isolation structures, located in the substrate, and each of the first isolation structures is located between two active regions arranged in parallel along the first direction, the first isolation structures are all annular, the second isolation structures are arranged in parallel along the second direction, each of the second isolation structures is located between two adjacent rows of active regions arranged in parallel along the second direction, and the first isolation structures are in communication with the second isolation structures; and
word lines, the word lines extend along a third direction and at least penetrating through the first isolation structures and the second isolation structures, the third direction is parallel to the surface of the substrate and intersects with both the first direction and the second direction.

DETAILED DESCRIPTION OF THE EMBODIMENTS

Hereinafter, specific embodiments of a semiconductor structure and a forming method therefor provided by some embodiments of the present disclosure will be described in detail in conjunction with the accompanying drawings.

Figure 1:
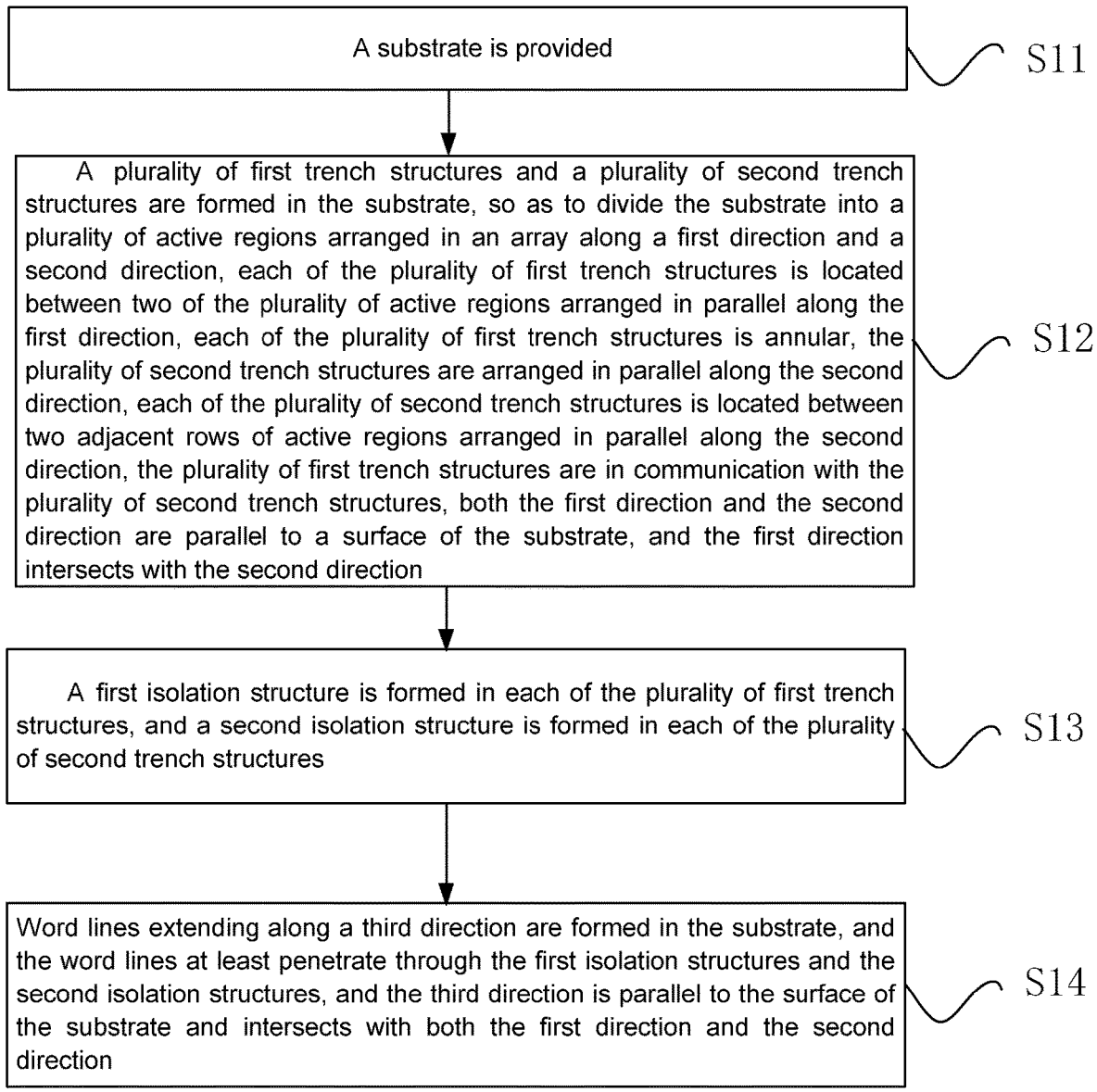
FIG. 1 is a flowchart of a method for forming a semiconductor structure according to specific embodiments of the present disclosure.
Figure 2A:
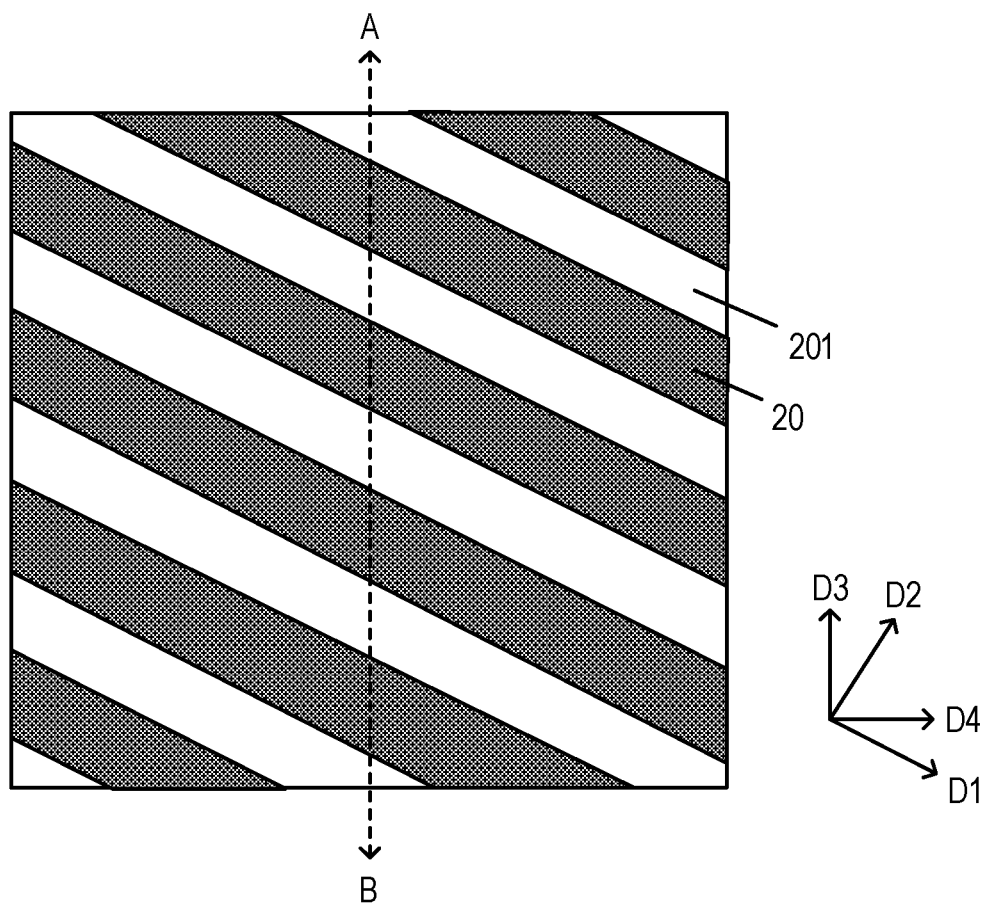
FIGS. 2A-2V are schematic sectional views of main processes during formation of a semiconductor structure according to specific embodiments of the present disclosure.
Figure 2B:
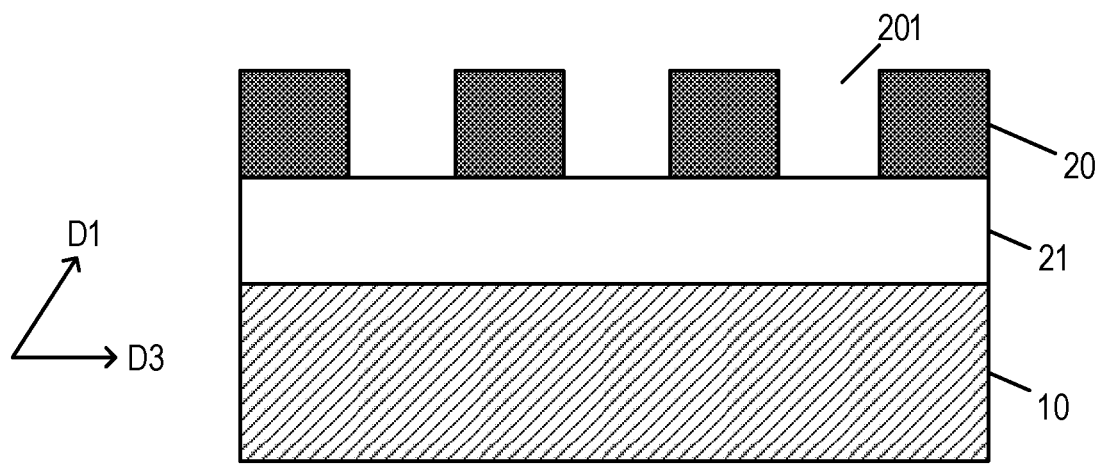
Figure 2C:
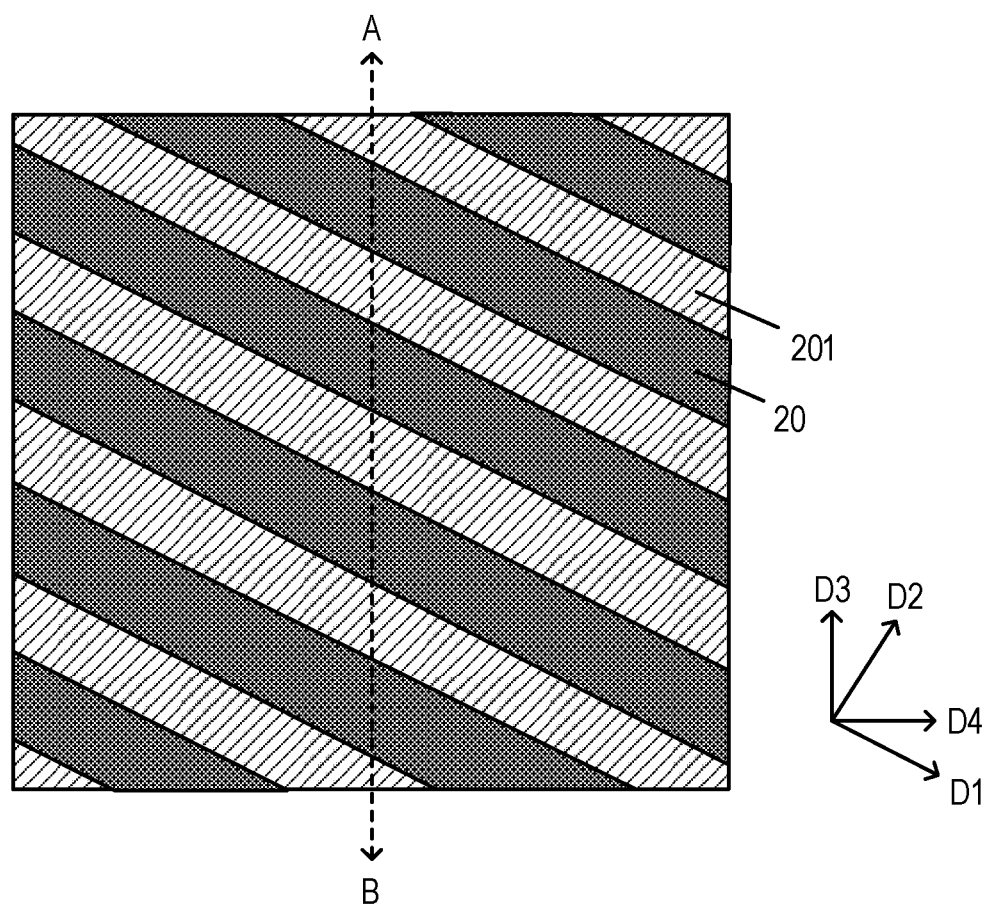
Figure 2D:
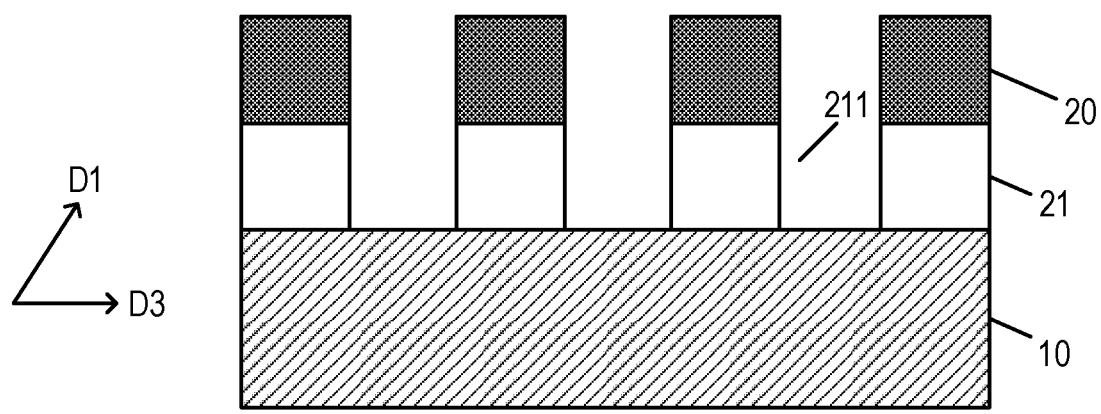

Some present specific embodiments provide a method for forming a semiconductor structure. FIG. 1 is a flowchart of a method for forming a semiconductor structure according to the specific embodiments of the present disclosure; and FIGS. 2A-2V are schematic sectional views of main processes during formation of a semiconductor structure according to the specific embodiments of the present disclosure. The semiconductor structure described in the specific embodiments can be, but is not limited to, a DRAM. As shown in FIGS. 1 and 2A-2V, the method for forming the semiconductor structure provided by the specific embodiments includes the following steps:

Step S11, a substrate 10 is provided, as shown in FIG. 2B.

Specifically, the substrate 10 can be, but is not limited to, a silicon substrate or a polysilicon substrate. In the specific embodiments, the substrate 10 is a silicon substrate is taken as an example for illustration. The substrate 10 is used for supporting device structures thereon. In other embodiments, the substrate 10 can be a semiconductor substrate such as gallium nitride, gallium arsenide, gallium carbide, silicon carbide, or SOI. The substrate 10 can be a single-layer substrate, and can also be a multi-layer substrate formed by stacking a plurality of semiconductor layers.

Step S12, a plurality of first trench structures 24 and a plurality of second trench structures 25 are formed in the substrate 10, so as to divide the substrate 10 into a plurality of active regions 26 arranged in an array along a first direction D1 and a second direction D2, each of the plurality of the first trench structures 24 is located between two of the plurality of active regions 26 arranged in parallel along the first direction D1, each of the plurality of first trench structures 24 is annular, the plurality of second trench structures 25 are arranged in parallel along the second direction D2, each of the plurality of second trench structures 25 is located between two adjacent rows of active regions 26 arranged in parallel along the second direction D2, the plurality of first trench structures 24 are in communication with the plurality of second trench structures 25, both the first direction D1 and the second direction D2 are parallel to a surface of the substrate 10, and the first direction D1 intersects with the second direction D2, as shown in FIGS. 2M-2R.

In some embodiments, forming the plurality of first trench structures 24 and the plurality of second trench structures 25 in the substrate 10 includes:

a patterned first mask layer 21 is formed, and the first mask layer 21 has a plurality of first etching structures and a plurality of second etching structures, the plurality of first etching structures are all annular and are arranged in an array along the first direction D1 and the second direction D2, each of the plurality of second etching structures is a strip-shaped structure extending along the first direction D1, the plurality of second etching structures are arranged in parallel along the second direction D2, and the plurality of first etching structures are in communication with the plurality of second etching structures; and the substrate 10 is etched along the plurality of first etching structures and the plurality of second etching structures, so as to form the plurality of first trench structures 24 and the plurality of second trench structures 25 in the substrate 10.

Figure 2E:
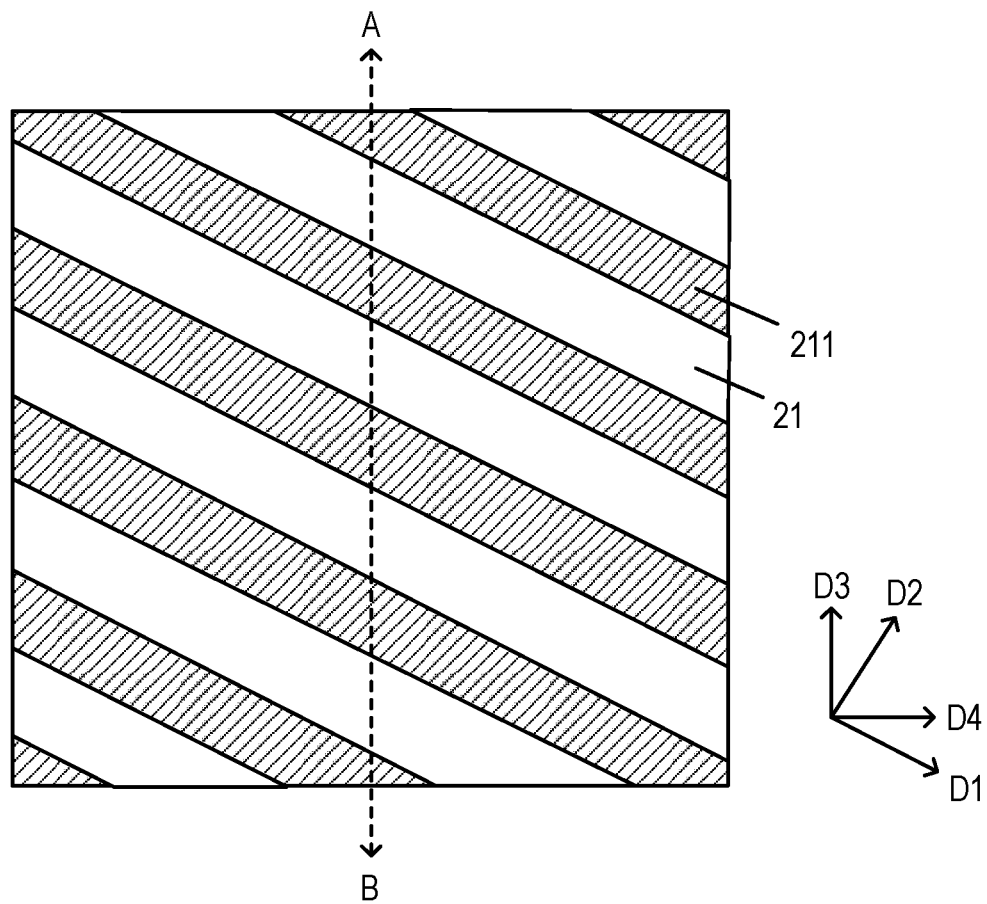
Figure 2F:
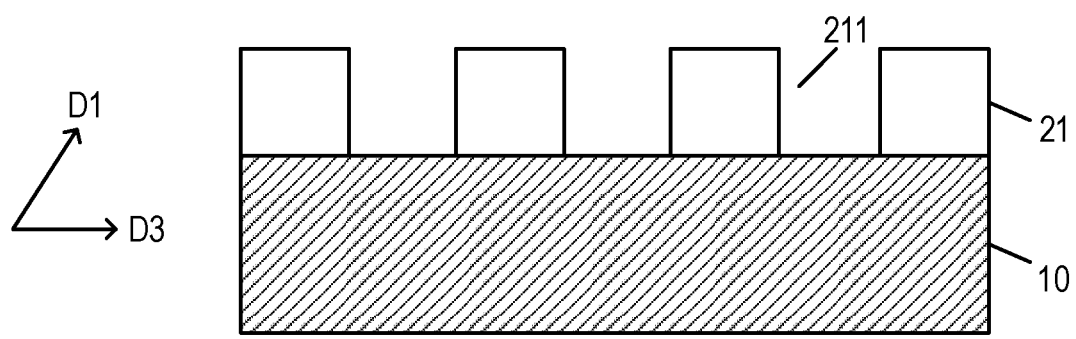
Figure 2G:
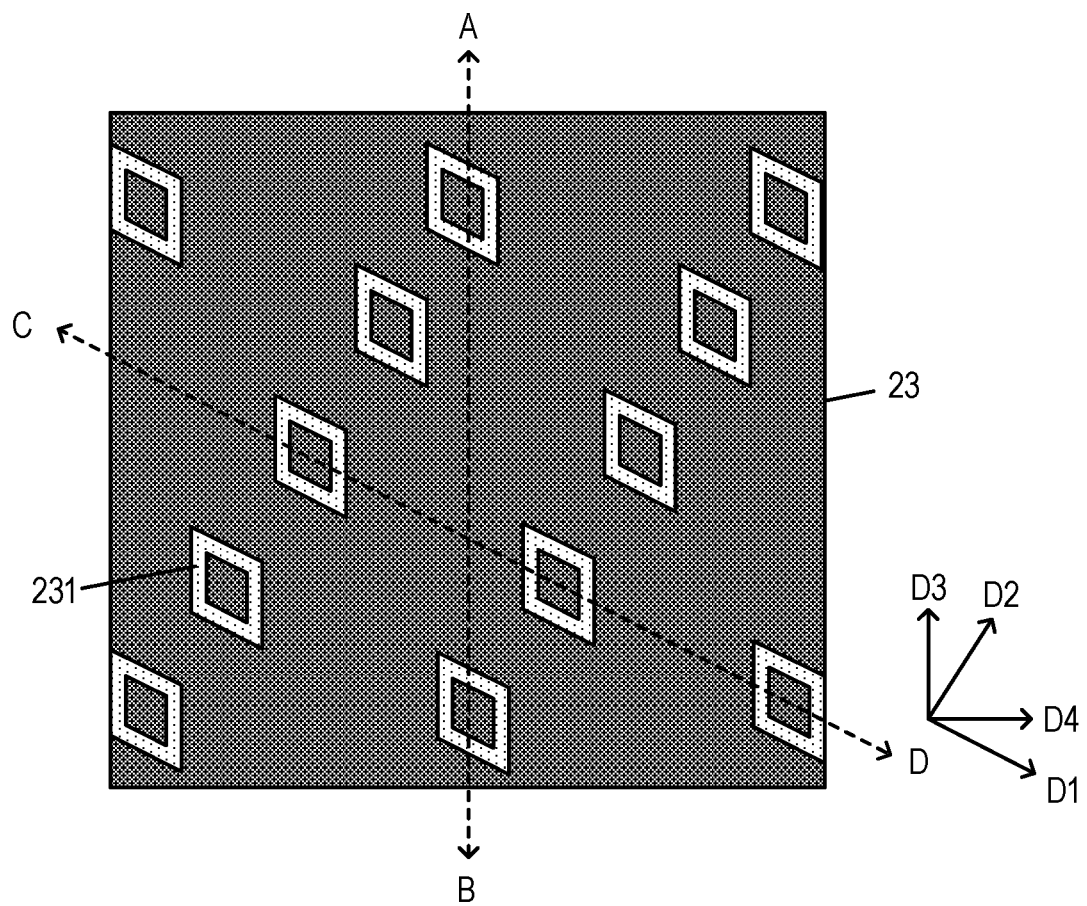
Figure 2H:
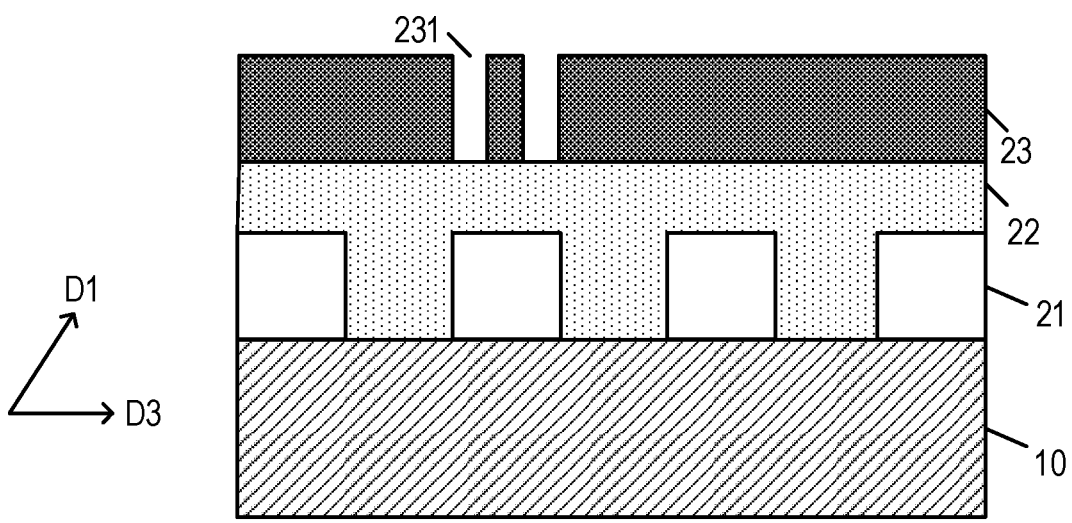
Figure 2I:
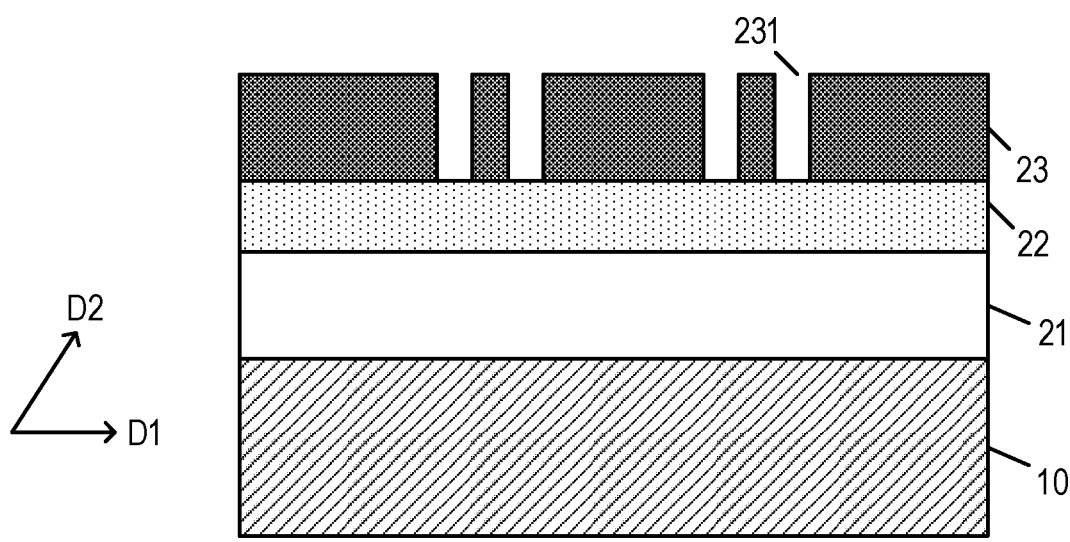
Figure 2J:
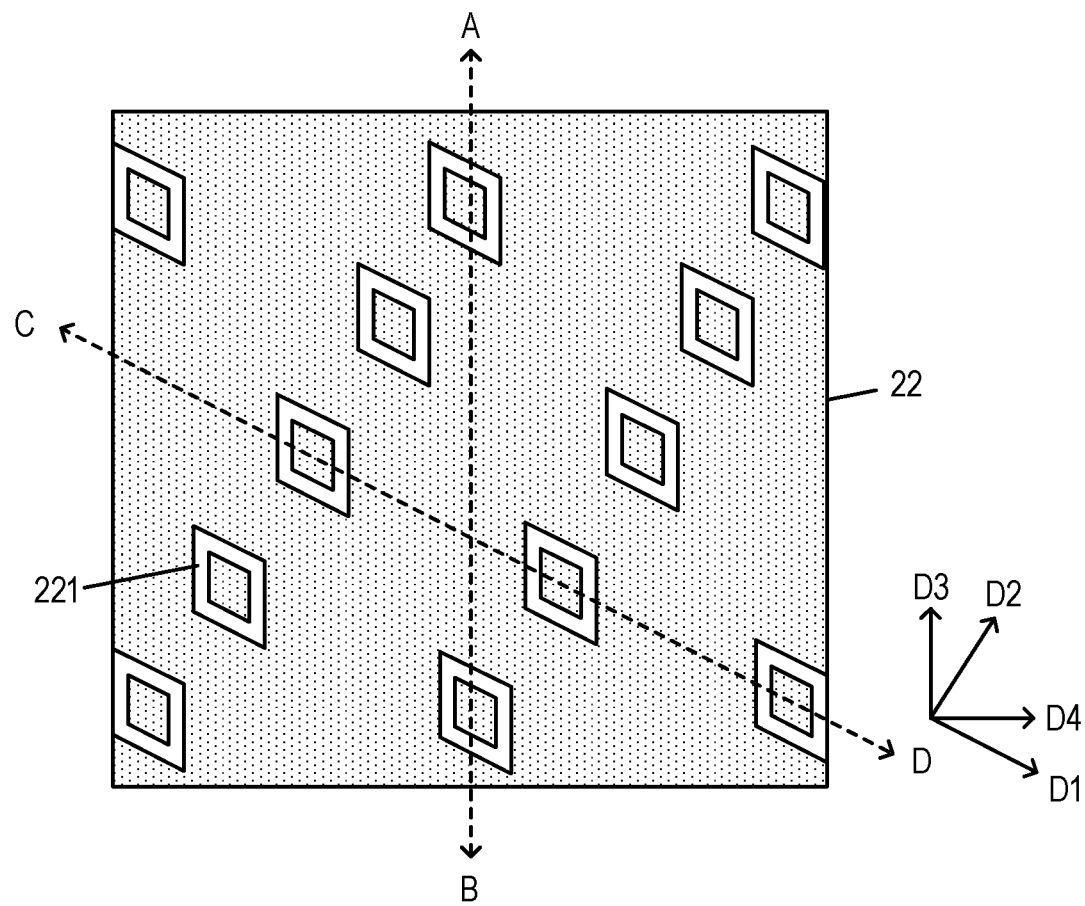
Figure 2K:
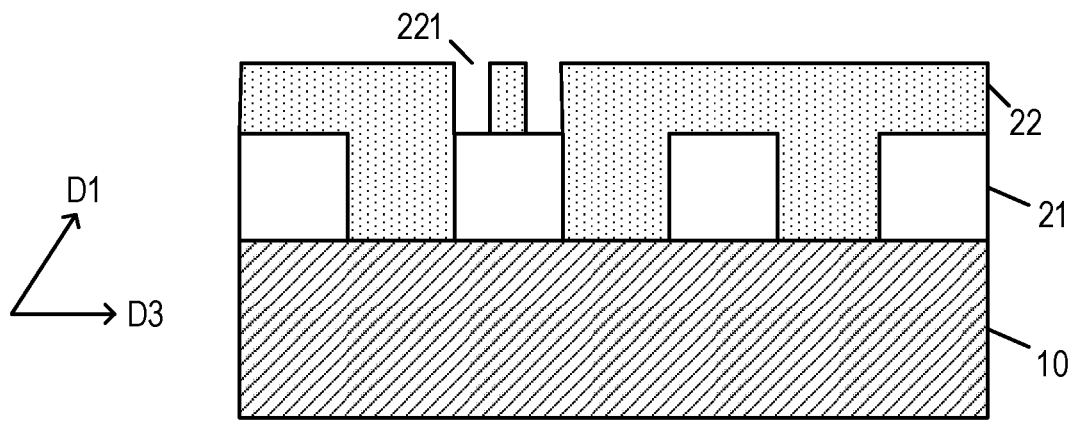
Figure 2L:
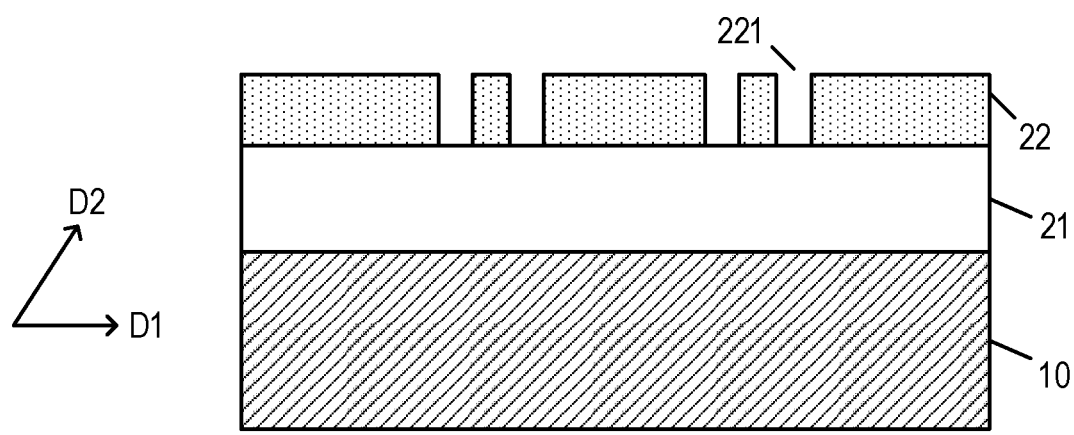
Figure 2M:
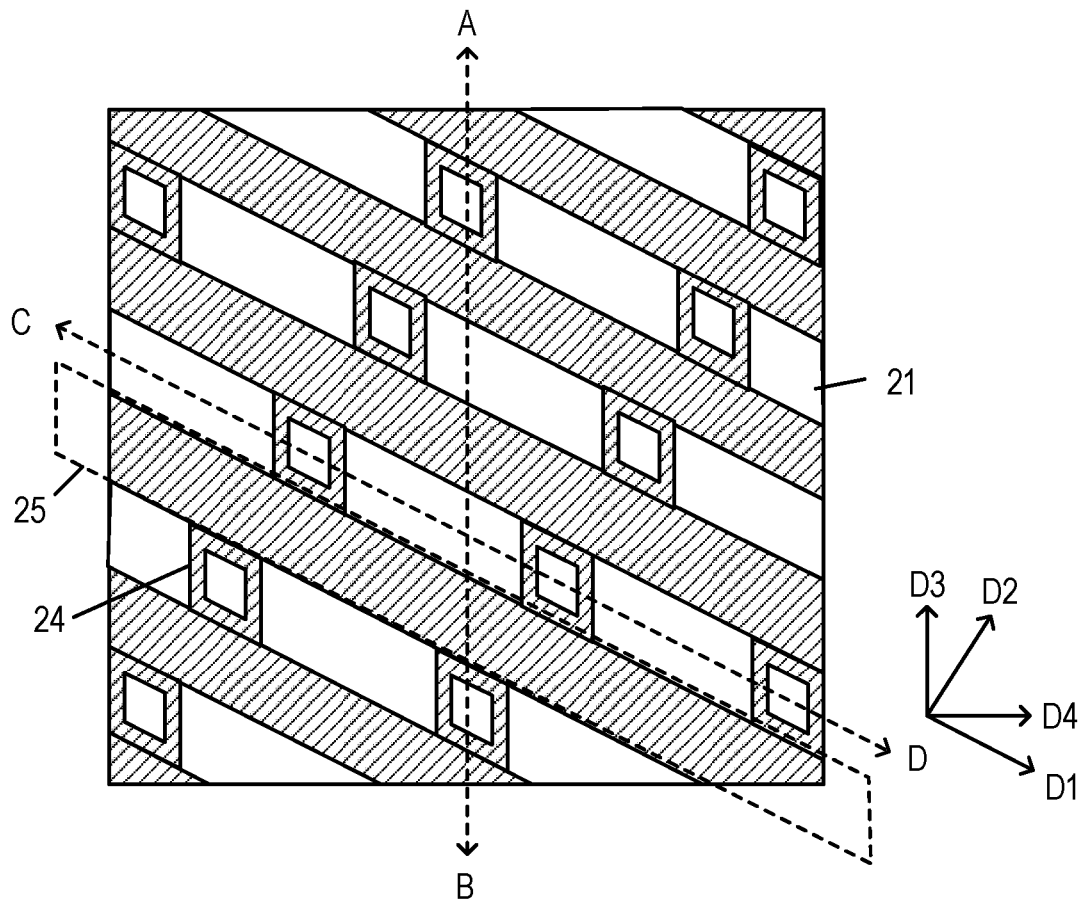
Figure 2N:
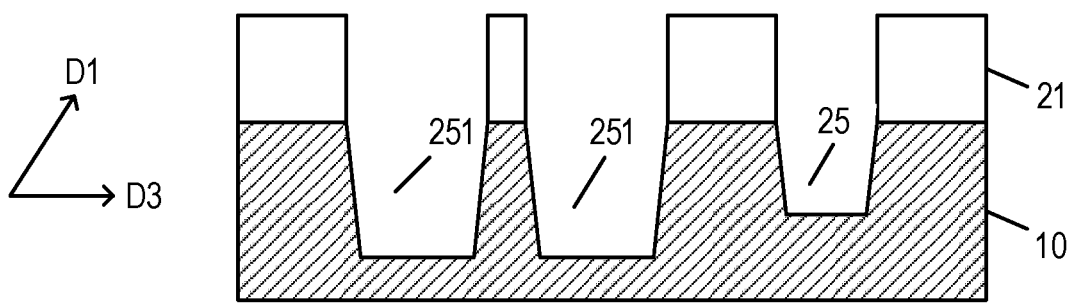
Figure 2O:
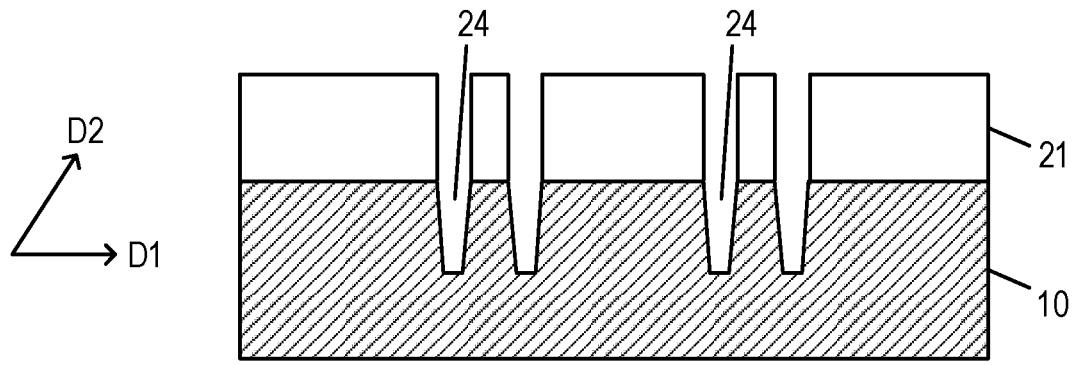

In some embodiments, forming the patterned first mask layer 21 includes:

a first mask layer 21 is formed on the surface of the substrate 10, and the first mask layer 21 has a plurality of first etching grooves 211 extending along the first direction D1 and arranged in parallel along the second direction D2, as shown in FIGS. 2E and 2F, FIG. 2F is a schematic sectional view of FIG. 2E along an AB direction;

the plurality of first etching grooves 211 are backfilled to form a second mask layer 22 covering the first mask layer 21;

the second mask layer 22 is patterned to form a plurality of second etching grooves 221 which are all annular, and the plurality of second etching grooves 221 are arranged in an array along the first direction D1 and the second direction D2, as shown in FIGS. 2J, 2K and 2L, FIG. 2K is a schematic sectional view of FIG. 2J along the AB direction, and FIG. 2L is a schematic sectional view of FIG. 2K along a CD direction; and the first mask layer 21 is etched along the plurality of second etching grooves 221 and the second mask layer 22 is removed, so as to form the patterned first mask layer 21, as shown in FIGS. 2M, 2N and 2O, FIG. 2N is a schematic sectional view of FIG. 2M along the AB direction, and FIG. 2O is a schematic sectional view of FIG. 2M along the CD direction.

Specifically, first, the first mask layer 21 is formed on the surface of the substrate 10, and a first photoresist layer 20 which is patterned is formed on a surface of the first mask layer 21, the first photoresist layer 20 has a plurality of first etching windows 201 penetrating through the first photoresist layer 20 along a direction perpendicular to the surface of the substrate 10, the plurality of first etching windows 201 are arranged in parallel along the second direction D2, and each of the plurality of first etching windows 201 extends along the first direction D1, as shown in FIGS. 2A and 2B, FIG. 2B is a schematic sectional view of FIG. 2A along the AB direction. Then, the first mask layer 21 is etched downward along the plurality of first etching windows 201, so as to form the plurality of first etching grooves 211 in the first mask layer 21, the plurality of first etching grooves 211 are arranged in parallel along the second direction D2, and each of the plurality of first etching grooves 211 extends along the first direction D1, as shown in FIGS. 2C and 2D, FIG. 2D is a schematic sectional view of FIG. 2C along the AB direction. After the first photoresist layer 20 is removed, a structure as shown in FIGS. 2E and 2F is obtained, FIG. 2F is a schematic sectional view of FIG. 2E along the AB direction. The material of the first mask layer 21 can be silicon nitride, silicon oxide or carbon. The first mask layer 21 and the substrate 10 should have a relatively high etching selectivity ratio, for example, the etching selectivity ratio between the first mask layer 21 and the substrate 10 is greater than 3. The CD direction is parallel to the first direction D1, and the AB direction is parallel to a third direction D3.

Then, the second mask layer 22 that fills up the plurality of first etching grooves 211 and covers the surface of the first mask layer 21 is formed. The second mask layer 22 and the first mask layer 21 should have a relatively high etching selectivity ratio, so as to facilitate subsequent selective etching. Then, a second photoresist layer 23 which is patterned is formed on a surface of the second mask layer 22, and the second photoresist layer 23 has second etching windows 231 which are all annular, as shown in FIGS. 2G, 2H and 2I, FIG. 2H is a schematic sectional view of FIG. 2G along the AB direction, and FIG. 2I is a schematic sectional view of FIG. 2G along the CD direction. Projections of the second etching windows 231 along a direction perpendicular to the surface of the substrate 10 are located in the plurality of first etching grooves 211. The second mask layer 22 is etched along the second etching windows 231, so as to form the plurality of second etching grooves 221 in the second mask layer 22; and after the second photoresist layer 23 is removed, a structure as shown in FIGS. 2J, 2K and 2L is obtained, and FIG. 2K is a schematic sectional view of FIG. 2J along the AB direction, and FIG. 2L is a schematic sectional view of FIG. 2J along the CD direction.

The plurality of second etching grooves 221 being arranged in the array along the first direction D1 and the second direction D2 means that the plurality of second etching grooves 221 are arranged in a two-dimensional array in a plane formed by the first direction D1 and the second direction D2. For example, the plurality of second etching grooves 221 are arranged in parallel along the first direction D1, so as to form a row of second etching grooves 221; and the plurality of second etching grooves 221 are arranged in parallel along the second direction D2, so as to form a column of second etching grooves 221.

After the first mask layer 21 is etched downward along the plurality of second etching grooves 221, the second mask layer 22 is removed, so as to form the plurality of first etching structures and the plurality of second etching structures in the first mask layer 21. Continuing to etch the substrate 10 along the plurality of first etching structures and the plurality of second etching structures, so as to form the plurality of first trench structures 24 and the plurality of second trench structures 25 in the substrate 10, as shown in FIGS. 2M, 2N and 2O, FIG. 2N is a schematic sectional view of FIG. 2M along the AB direction, and FIG. 2O is a schematic sectional view of FIG. 2M along the CD direction. As shown in FIGS. 2M and 2N, partial regions of the plurality of second trench structures 25 are in communication with the plurality of first trench structures 24, to form communication trenches 251. Due to the influence of an etch loading effect, an extension depth of the communication trenches 251 inside the substrate 10 is greater than an extension depth of other partial regions of the plurality of second trench structures 25 inside the substrate 10.

Figure 2P:
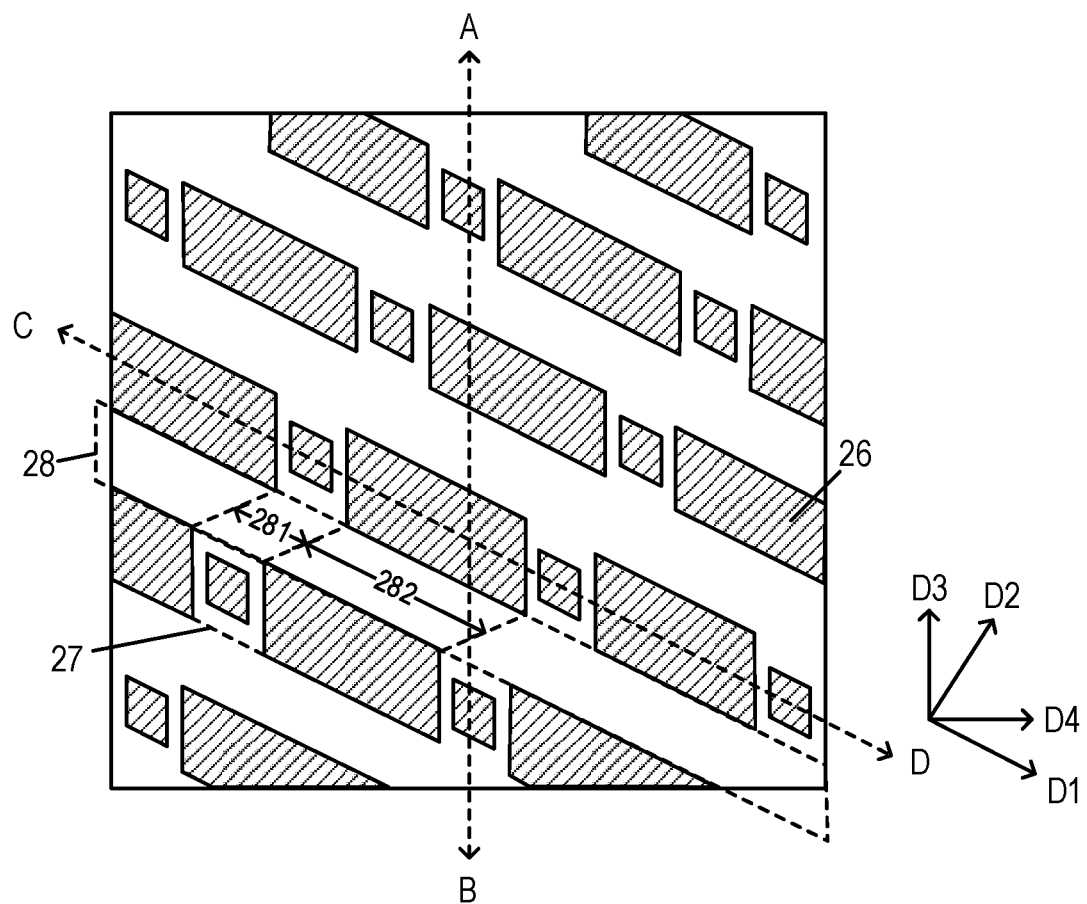
Figure 2Q:
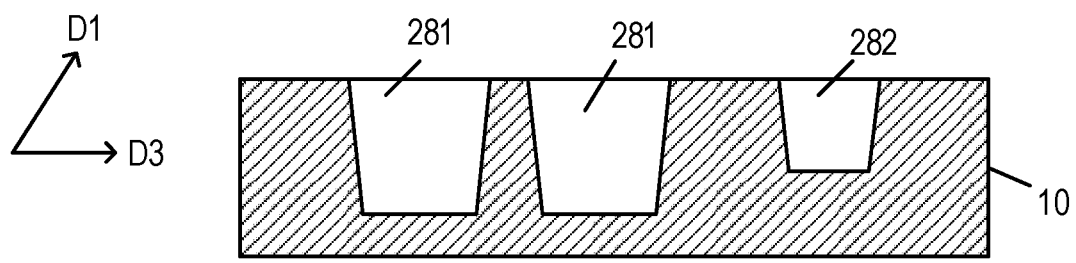
Figure 2R:
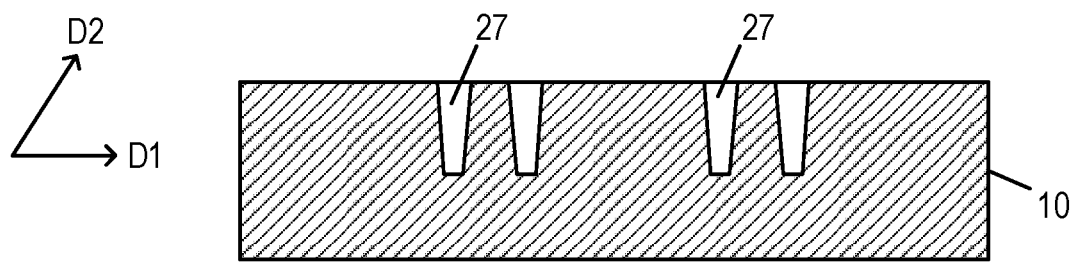

Step S13: a first isolation structures 27 is formed in each of the plurality of first trench structures 24, and a second isolation structures 28 is formed in each of the plurality of second trench structures 25, as shown in FIGS. 2P, 2Q and 2R, FIG. 2Q is a schematic sectional view of FIG. 2P along the AB direction, and FIG. 2R is a schematic sectional view of FIG. 2P along the CD direction.

In some embodiments, forming the first isolation structure 27 in each of the plurality of first trench structures 24, and forming the second isolation structures 28 in each of the plurality of second trench structures 25 include:
dielectric materials are filled in the plurality of first trench structures 24 and the plurality of second trench structures 25 while forming the first isolation structures 27 and the second isolation structures 28.

Specifically, after the dielectric materials are filled and the first mask layer 21 is removed, the plurality of active regions 26 arranged in the array along the first direction D1 and the second direction D2 are formed in the substrate 10, as shown in FIGS. 2P, 2Q and 2R. The plurality of active regions 26 being arranged in the array along the first direction D1 and the second direction D2 means that the plurality of active regions 26 are arranged in a two-dimensional array in a plane formed by the first direction D1 and the second direction D2. The dielectric materials can have a dielectric constant value less than 3 (e.g., a silicon oxide material), so as to isolate electric leakage between adjacent active regions 26 and to further reduce an charge coupling effect between word lines and adjacent active regions.

Figure 2S:
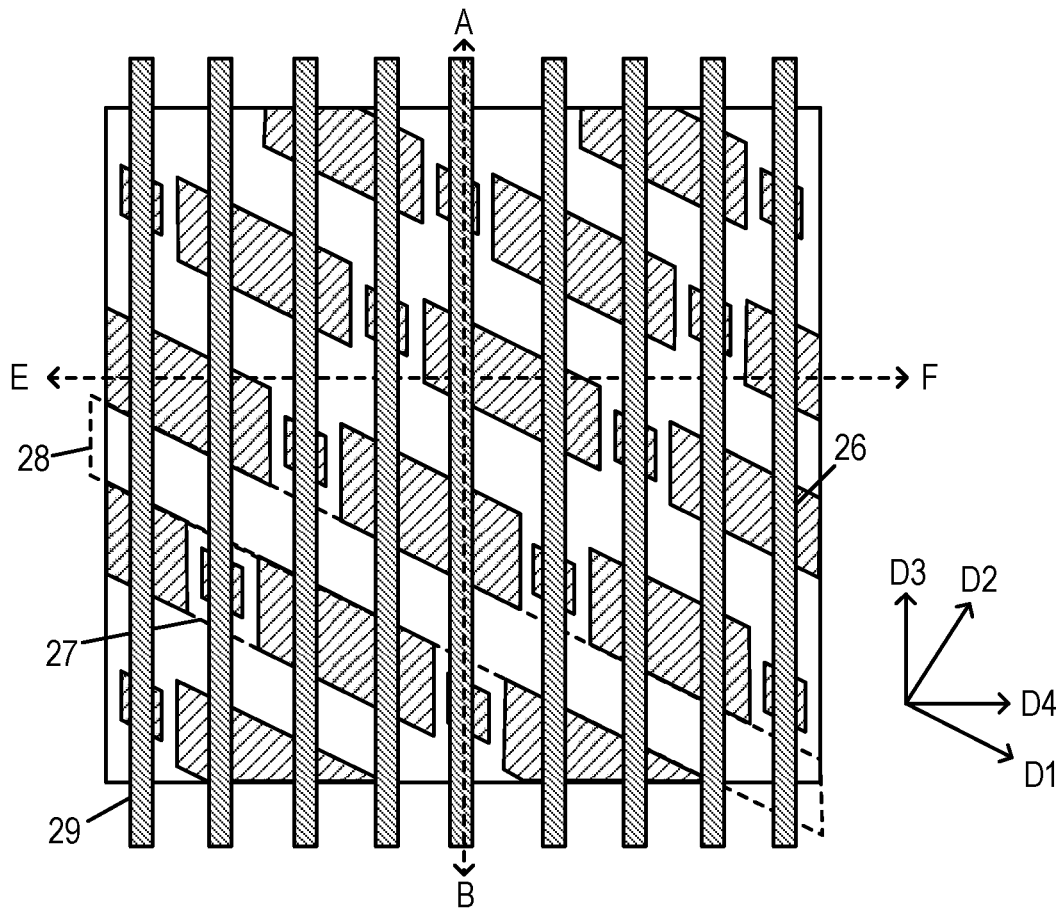
Figure 2T:
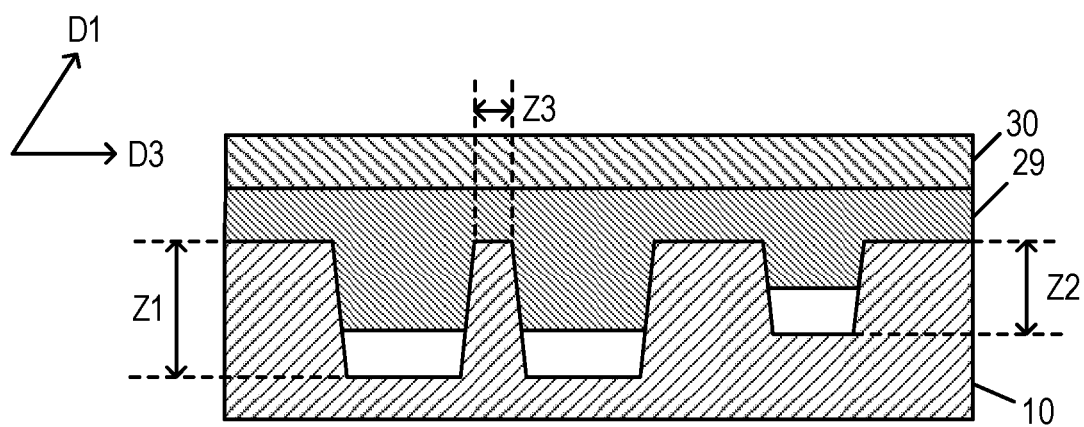
Figure 2U:
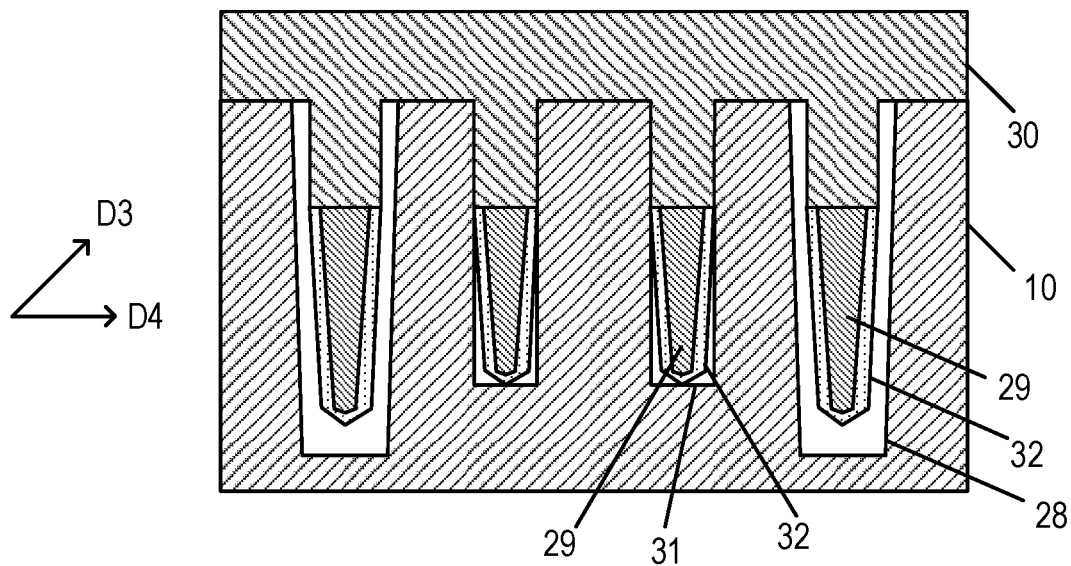
Figure 2V:
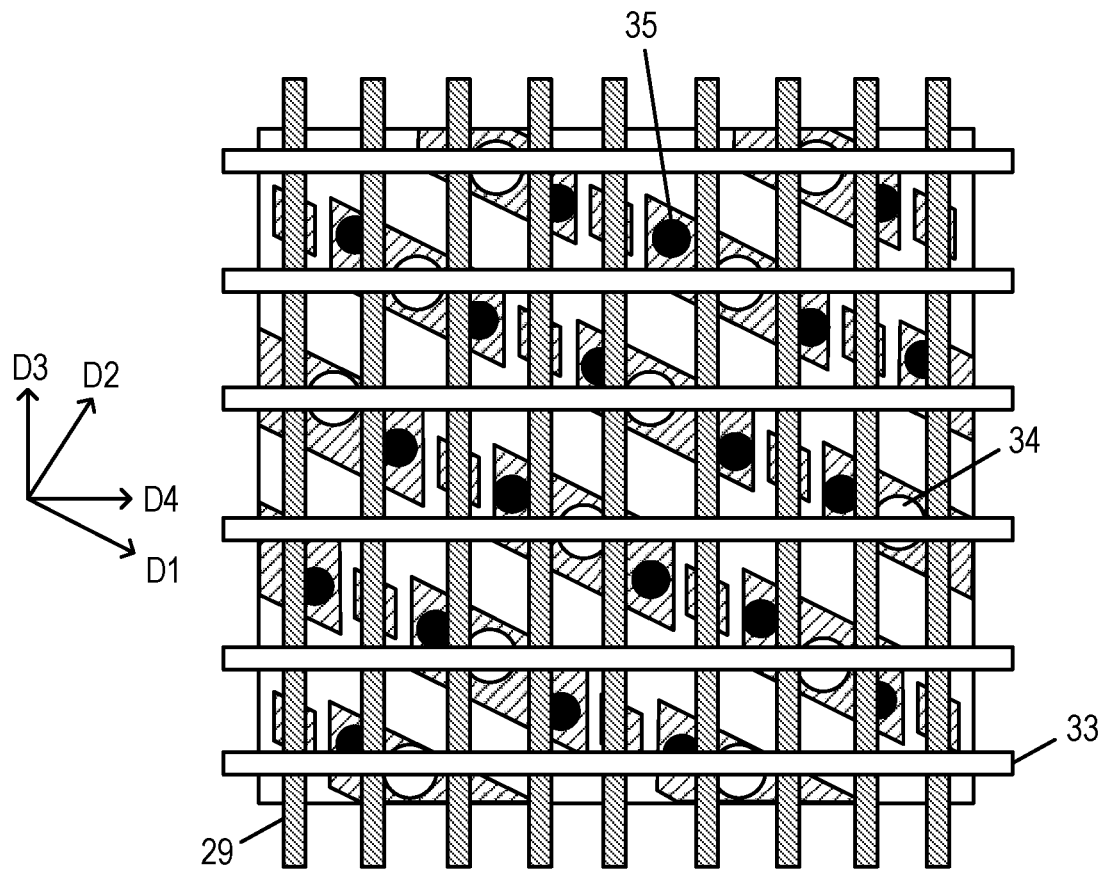

Step S14, word lines 29 extending along a third direction D3 are formed in the substrate 10, and the word lines 29 at least penetrate through the first isolation structures 27 and the second isolation structures 28, and the third direction D3 is parallel to the surface of the substrate 10 and intersects with both the first direction D1 and the second direction D2, as shown in FIGS. 2S, 2T and 2U, FIG. 2T is a schematic sectional view of FIG. 2S along the AB direction, and FIG. 2U is a schematic sectional view of FIG. 2S in an EF direction.

Before forming the word lines 29, the plurality of active regions inside the substrate 10 can be further doped, for example, doped with elements such as boron to form channel regions, doped with elements such as phosphorus to form an LDD (lightly doped drain region), and doped with elements such as arsenic to form shallow junctions.

In some embodiments, forming the word lines 29 extending along the third direction D3 in the substrate 10 includes:
etching the first isolation structures 27, the second isolation structures 28 and the plurality of active regions 26 along the third direction D3, so as to form third trenches 31 penetrating through the first isolation structures 27, the second isolation structures 28 and the plurality of active regions 26 along the third direction D3; and
filling the third trenches 31, to form the word lines 29.

Specifically, after the first isolation structures 27 and the second isolation structures 28 are formed, the first isolation structures 27 and the second isolation structures 28 are etched back, and the plurality of active regions 26 are etched at the same time, so as to form the third trenches 31 extending along the third direction D3. Then, gate dielectric layers 32 covering inner walls of the third trenches 31, and word lines 29 covering surfaces of the gate dielectric layers 32 and filling up the third trenches 31 are formed. A person skilled in the art would also have been able to form diffusion barrier layers between the gate dielectric layers 32 and the word lines 29 according to actual needs. The material of the diffusion barrier layers can be, but is not limited to TiN. Thereafter, an insulating dielectric layer 30 covering the word lines 29 is formed.

In the specific embodiments, one of the first isolation structures 27 and one of the second isolation structures 28 jointly form a shallow trench isolation structure for isolating adjacent two active regions, the first isolation structures 27 which are annular reduces the charge coupling effect between the word lines 29 and the adjacent active regions 26.

In some embodiments, a trench width of each of the plurality of first trench structures 24 along the first direction D1 is less than a trench width of each of the plurality of second trench structures 25 along the second direction D2.

Each of the plurality of first trench structures 24 is configured to isolate two adjacent active regions 26 arranged along the first direction D1, and each of the plurality of second trench structures 25 is configured to isolate two adjacent rows of active regions 26 arranged along the second direction D2 (each row of active regions 26 include a plurality of active regions 26 arranged in parallel along the first direction D1). The trench width of each of the plurality of first trench structures 24 along the first direction D1 is less than the trench width of each of the plurality of second trench structures 25 along the second direction D2, which can effectively avoid signal crosstalk between two adjacent rows of active regions 26 arranged along the second direction D2.

In some embodiments, the inner ring diameter Z3 (see FIG. 2T) of each of the plurality of first trench structures 24 is 20 nm to 80 nm.

In some embodiments, the second isolation structure 28 includes first sub-isolation portions 281 and second sub-isolation portions 282, and each of the first sub-isolation portions 281 is located between two of the first isolation structures 27 arranged in parallel along the second direction D2, and each of the second sub-isolation portion 282 is located between two of the plurality of active regions 26 arranged in parallel along the second direction D2.

When the first sub-isolation portions 281 and the second sub-isolation portions 282 are formed, sizes of mask openings of the first sub-isolation portions 281 are greater than sizes of mask openings of the second sub-isolation portions 282, and thus an extension depth Z1 of each of the first sub-isolation portions 281 inside the substrate 10 is greater than an extension depth Z2 of each of the second sub-isolation portions 282 inside the substrate 10, refer to FIGS. 2P and 2Q.

In some embodiments, the extension depth of each of the first sub-isolation portions 281 inside the substrate 10 is 200 nm to 500 nm.

In some embodiments, the extension depth of each of the second sub-isolation portions 282 inside the substrate 10 is 100 nm to 300 nm.

After the word lines 29 are formed, capacitor contact portions 35 and bit line contact portions 34 can be further formed in the plurality of active regions. Two capacitor contact portions 35 and one bit line contact portion 34 are formed in each of the plurality of active regions 26, the two capacitor contact portions 35 are distributed at two opposite ends of the one active region 26 along the first direction D1, and the bit line contact portion 34 is located between the two capacitor contact portions 35. Next, a plurality of bit lines 33 arranged in parallel along the third direction D3 are formed above the substrate 10, each of the plurality of bit lines 33 extends in a fourth direction D4, and each of the bit line contact portions 34 is electrically connected to one bit line 33, so as to obtain a structure as shown in FIG. 2V.

More than that, the present specific embodiments further provide a semiconductor structure. The semiconductor structure provided by the specific embodiments can be formed by using the method as shown in FIGS. 1 and 2A-2V. For schematic views of the semiconductor structure provided by the specific embodiment, reference can be made to FIGS. 2P-2V. As shown in FIGS. 2P to 2V, the semiconductor structure provided by the specific embodiments includes:

a substrate 10;
a plurality of active regions 26, and the plurality of active regions 26 are arranged in an array in a first direction D1 and a second direction D2 inside the substrate 10, both the first direction D1 and the second direction D2 are parallel to a surface of the substrate 10, and the first direction D1 intersects with the second direction D2;
first isolation structures 27 and second isolation structures 28, located in the substrate 10, and each of the first isolation structures 27 is located between two active regions 26 arranged in parallel along the first direction D1, the first isolation structures 27 are all annular, the second isolation structures 28 are arranged in parallel along the second direction D2, each of the second isolation structures 28 is located between two adjacent rows of active regions 26 arranged in parallel along the second direction D2, and the first isolation structures 27 are in communication with the second isolation structures 28; and
word lines 29, the word lines 29 extend along a third direction D3 and at least penetrate through the first isolation structures 27 and the second isolation structures 28, and the third direction D3 is parallel to the surface of the substrate 10, and intersects with both the first direction D1 and the second direction D2.

In some embodiments, a width of each of the first isolation structures 27 along the first direction D1 is less than a width of each of the second isolation structures 28 along the second direction D2.

In some embodiments, an inner ring diameter Z3 of each of the first isolation structures 27 is 20 nm to 80 nm.

In some embodiments, each of the second isolation structures 28 includes first sub-isolation portions 281 and second sub-isolation portions 282, and each of the first sub-isolation portions 281 is located between two of the first isolation structures 27 arranged in parallel along the second direction D2, and each of the second sub-isolation portions 282 is located between two of the plurality of active regions 26 arranged in parallel along the second direction D2;

an extension depth Z1 of each of the first sub-isolation portions 281 inside the substrate 10 is greater than an extension depth Z2 of the second sub-isolation portions 282 inside the substrate 10.

In some embodiments, the extension depth of each of the first sub-isolation portions 281 inside the substrate 10 is 200 nm to 500 nm.

In some embodiments, the extension depth of each of the second sub-isolation portions 282 inside the substrate 10 is 100 nm to 300 nm.

In some embodiments, a material of the first isolation structures 27 is same with a material of the second isolation structures 28. For example, the materials are both silicon oxide.

In some embodiments, a dielectric constant value of each material of the first isolation structures 27 and a dielectric constant value of each material of the second isolation structures 28 are both less than 3.

In some embodiments, the word lines 29 are arranged in parallel in a fourth direction D4, the fourth direction D4 is parallel to the surface of the substrate 10 and perpendicular to the third direction D3; and
two adjacent word lines 29 penetrate through a same active region 26.

In some embodiments, the semiconductor structure further includes:

two capacitor contact portions 35 located in one active region 26, the two capacitor contact portions 35 are distributed at two opposite ends of the active region 26 along the first direction D1;
a bit line contact portion 34 located in the active region 26, the bit line contact portion 34 is located between the two the capacitor contact portions 35; and
a plurality of bit lines 33 arranged in parallel along the third direction D3, each of the plurality of bit lines 33 extends in the fourth direction D4, and each of the plurality of bit line contact portions 34 is electrically connected to one of the plurality of bit lines 33.

The semiconductor structure and the method for forming the semiconductor structure provided in embodiments of the present disclosure, the plurality of first isolation structures and the plurality of second isolation structures located in the substrate divide the substrate into the plurality of active regions arranged in the array along the first direction and the second direction, each of the plurality of first isolation structures is located between two of the plurality of active regions arranged in parallel along the first direction, the a plurality of first isolation structures are all annular, the plurality of second isolation structures are arranged in parallel along the second direction, each of the plurality of second isolation structures is located between two adjacent rows of active regions arranged in parallel along the second direction, and the plurality of first isolation structures are in communication with the plurality of second isolation structures. That is to say, by changing the arrangement manner of the plurality of active regions and the isolation structures inside the substrate, the coupling effect between the word lines and adjacent active regions is reduced, and the electrical performance of the semiconductor structure is improved.

The description above only relates to preferred embodiments of the present disclosure. It should be noted that for a person of ordinary skill in the art, several improvements and modifications can also be made without departing from the technical principle of some embodiments of the present disclosure, and these improvements and modifications shall also be considered as within the scope of protection of some embodiments of the present disclosure.

What is claimed is:

1. A method for forming a semiconductor structure, comprising:
    providing a substrate;
    forming a plurality of first trench structures and a plurality of second trench structures in the substrate, so as to divide the substrate into a plurality of active regions arranged in an array along a first direction and a second direction, wherein each of the plurality of first trench structures is located between two of the plurality of active regions arranged in parallel along the first direction, each of the plurality of first trench structures is annular, the plurality of second trench structures are arranged in parallel along the second direction, each of the plurality of second trench structures is located between two adjacent rows of active regions arranged in parallel along the second direction, the plurality of first trench structures are in communication with the plurality of second trench structures, both the first direction and the second direction are parallel to a surface of the substrate, and the first direction intersects with the second direction;
    forming a first isolation structure in each of the plurality of first trench structures, and forming a second isolation structure in each of the plurality of second trench structures; and
    forming word lines extending along a third direction in the substrate, wherein the word lines at least penetrate through the first isolation structures and the second isolation structures, and the third direction is parallel to the surface of the substrate and intersects with both the first direction and the second direction; and, wherein
    forming the plurality of first trench structures and the plurality of second trench structures in the substrate comprises:
    forming a patterned first mask layer, wherein the patterned first mask layer has a plurality of first etching structures and a plurality of second etching structures, the plurality of first etching structures are all annular and are arranged in an array along the first direction and the second direction, each of the plurality of second etching structures is a strip-shaped structure extending along the first direction, the plurality of second etching structures are arranged in parallel along the second direction, and the plurality of first etching structures are in communication with the plurality of second etching structures; and
    etching the substrate along the plurality of first etching structures and the plurality of second etching structures, so as to form the plurality of first trench structures and the plurality of second trench structures in the substrate; and, wherein
    forming the patterned first mask layer comprises:
    forming a first mask layer on the surface of the substrate, wherein the first mask layer has a plurality of first etching grooves extending along the first direction and arranged in parallel along the second direction;
    backfilling the plurality of first etching grooves to form a second mask layer covering the first mask layer;
    patterning the second mask layer to form a plurality of second etching grooves which are all annular, wherein the plurality of second etching grooves which are all annular are arranged in an array along the first direction and the second direction; and
    etching the first mask layer along the plurality of second etching grooves and removing the second mask layer, so as to form the patterned first mask layer.

2. The method for forming the semiconductor structure according to claim 1, wherein each of the plurality of first trench structures has a trench width along the first direction less than a trench width of each of the plurality of second trench structures along the second direction.

3. The method for forming the semiconductor structure according to claim 1, wherein an inner ring diameter of each of the plurality of first trench structures is 20 nm to 80 nm.

4. The method for forming the semiconductor structure according to claim 1, wherein
    the second isolation structure comprises first sub-isolation portions and second sub-isolation portions, wherein each of the first sub-isolation portions is located between two of the first isolation structures arranged in parallel along the second direction, and each of the second sub-isolation portions is located between two of the plurality of active regions arranged in parallel along the second direction; and each of the first sub-isolation portions has an extension depth in the substrate greater than an extension depth of each of the second sub-isolation portions in the substrate.

5. The method for forming the semiconductor structure according to claim 4, wherein the extension depth of each of the first sub-isolation portions inside the substrate is 200 nm to 500 nm.

6. The method for forming the semiconductor structure according to claim 4, wherein the extension depth of each of the second sub-isolation portions inside the substrate is 100 nm to 300 nm.

7. The method for forming the semiconductor structure according to claim 1, wherein
    forming the first isolation structure in each of the plurality of first trench structures, and forming the second isolation structure in each of the plurality of second trench structures comprise:
    filling dielectric materials in the plurality of first trench structures and the plurality of second trench structures while forming the first isolation structures and the second isolation structures.

8. The method for forming the semiconductor structure according to claim 1, wherein forming the word lines extending along the third direction in the substrate comprises:

etching the first isolation structures, the second isolation structures and the plurality of active regions along the third direction, so as to form third trenches penetrating through the first isolation structures, the second isolation structures and the plurality of active regions along the third direction; and filling the third trenches, to form the word lines.

9. A semiconductor structure, comprising:
a substrate;
a plurality of active regions, wherein the plurality of active regions are arranged in an array along a first direction and a second direction inside the substrate, both the first direction and the second direction are parallel to a surface of the substrate, and the first direction intersects with the second direction;
first isolation structures and second isolation structures, located in the substrate, wherein each of the first isolation structures is located between two active regions arranged in parallel along the first direction, the first isolation structures are all annular, the second isolation structures are arranged in parallel along the second direction, each of the second isolation structures is located between two adjacent rows of active regions arranged in parallel along the second direction, and the first isolation structures are in communication with the second isolation structures; and
word lines, the word lines extending along a third direction and at least penetrating through the first isolation structures and the second isolation structures, the third direction being parallel to the surface of the substrate and intersecting with both the first direction and the second direction; and, wherein
a width of each of the first isolation structures along the first direction is less than a width of each of the second isolation structures along the second direction.

10. The semiconductor structure according to claim 9, wherein
an inner ring diameter of each of the first isolation structures is 20 nm to 80 nm.

11. The semiconductor structure according to claim 9, wherein
each of the second isolation structures comprises first sub-isolation portions and second sub-isolation portions, wherein each of the first sub-isolation portions is located between two of the first isolation structures arranged in parallel along the second direction, and each of the second sub-isolation portions is located between two of the plurality of active regions arranged in parallel along the second direction; and
each of the first sub-isolation portions has an extension depth in the substrate greater than an extension depth of each of the second sub-isolation portions in the substrate.

12. The semiconductor structure according to claim 11, wherein
the extension depth of each of the first sub-isolation portions inside the substrate is 200 nm to 500 nm.

13. The semiconductor structure according to claim 11, wherein the extension depth of each of the second sub-isolation portions inside the substrate is 100 nm to 300 nm.

14. The semiconductor structure according to claim 9, wherein a material of the first isolation structures is same with a material of the second isolation structures.

15. The semiconductor structure according to claim 9, wherein a dielectric constant value of each material of the first isolation structures and a dielectric constant value of each material of the second isolation structures are both less than 3.

16. The semiconductor structure according to claim 9, wherein the word lines are arranged in parallel along a fourth direction, and the fourth direction is parallel to the surface of the substrate and perpendicular to the third direction; and two adjacent word lines penetrate through a same active region.

17. The semiconductor structure according to claim 16, wherein the semiconductor structure further comprises:
two capacitor contact portions located in one active region, the two capacitor contact portions being distributed at two opposite ends of the active region along the first direction; a bit line contact portion located in the active region, the bit line contact portion being located between the two capacitor contact portions; and a plurality of bit lines arranged in parallel along the third direction, each of the plurality of bit lines extending in the fourth direction, and each bit line contact portion being electrically connected to one of the plurality of bit lines.

* * * * *